(12) United States Patent
Serrano Gotarredona et al.

(10) Patent No.: US 11,680,969 B2
(45) Date of Patent: Jun. 20, 2023

(54) CAPACITANCE TO DIGITAL CONVERTER, INTEGRATED SENSOR INTERFACE AND SENSOR DEVICE

(71) Applicant: ams AG, Premstätten (AT)

(72) Inventors: Rafael Serrano Gotarredona, Premstaetten (AT); José Manuel García González, Premstaetten (AT)

(73) Assignee: ams AG, Premstätten (AT)

( * ) Notice: Subject to any disclaimer, the term of this patent is extended or adjusted under 35 U.S.C. 154(b) by 268 days.

(21) Appl. No.: 17/281,371

(22) PCT Filed: Sep. 25, 2019

(86) PCT No.: PCT/EP2019/075914
§ 371 (c)(1),
(2) Date: Mar. 30, 2021

(87) PCT Pub. No.: WO2020/069941
PCT Pub. Date: Apr. 9, 2020

(65) Prior Publication Data
US 2022/0034950 A1     Feb. 3, 2022

(30) Foreign Application Priority Data
Oct. 2, 2018   (EP) ..................................... 18198139

(51) Int. Cl.
*G01R 27/26* (2006.01)
*G01D 5/24* (2006.01)
*H03M 3/00* (2006.01)

(52) U.S. Cl.
CPC ........... *G01R 27/2605* (2013.01); *G01D 5/24* (2013.01); *H03M 3/458* (2013.01)

(58) Field of Classification Search
CPC ........ G01R 27/00; G01R 27/02; G01R 27/26; G01R 27/2605; G01R 19/00; G01R 19/25;
(Continued)

(56) References Cited

U.S. PATENT DOCUMENTS

| 2005/0219097 A1 | 10/2005 | Atriss et al. |
| 2010/0042346 A1 | 2/2010 | Kuang |

(Continued)

FOREIGN PATENT DOCUMENTS

| CN | 106840216 A | * | 6/2017 | ............... G01D 5/16 |
| EP | 3575764 A1 | * | 12/2019 | ............... G01D 5/24 |

(Continued)

OTHER PUBLICATIONS

"PCap04 Capacitance-to-Digital Converter", ams Datasheet, Apr. 4, 2018, 182 pages.
(Continued)

*Primary Examiner* — Hoai-An D. Nguyen
(74) *Attorney, Agent, or Firm* — MH2 Technology Law Group, LLP

(57) ABSTRACT

A capacitance to digital converter, CDC, has a first and a second reference terminal for receiving first and second reference voltages, a reference block comprising one or more reference charge stores and being coupled to the first and second reference terminals via a first switching block, a scaling block for providing at third and fourth reference terminals downscaled voltages from the first and second reference voltages depending on a scaling factor, first and second measurement terminals for connecting a capacitive sensor element, the first measurement terminal being coupled to the third and fourth reference terminals via a second switching block, and a processing block coupled to the reference block and to the second measurement terminal
(Continued)

and being configured to determine a digital output signal based on a charge distribution between the sensor element and the reference block and based on the scaling factor, the output signal representing a capacitance value of the sensor element.

16 Claims, 4 Drawing Sheets

(58) Field of Classification Search
CPC .... G01R 19/257; G01R 23/00; G01R 23/005; G01R 31/00; G01R 31/28; G01R 31/302; G01R 31/312; G01D 5/00; G01D 5/12; G01D 5/14; G01D 5/24; H03M 3/00; H03M 3/30; H03M 3/458
USPC ................................ 324/600, 602, 605, 607
See application file for complete search history.

(56) References Cited

U.S. PATENT DOCUMENTS

| | | |
|---|---|---|
| 2012/0112947 A1 | 5/2012 | Krauss et al. |
| 2012/0218020 A1 | 8/2012 | Erdogan et al. |
| 2015/0295587 A1 | 10/2015 | Garcia Gonzalez et al. |
| 2016/0265995 A1 | 9/2016 | Wang et al. |
| 2017/0310291 A1 | 10/2017 | Garcia Gonzalez et al. |
| 2018/0136158 A1 | 5/2018 | Garcia Gonzalez et al. |

FOREIGN PATENT DOCUMENTS

| | | | | |
|---|---|---|---|---|
| JP | 2004347530 A | | 12/2004 | |
| KR | 1020160007433 A | | 1/2016 | |
| KR | 1020160043928 A | | 4/2016 | |
| KR | 101620590 B1 | * | 5/2016 | ............. G01R 27/26 |
| KR | 1020160102900 A | | 8/2016 | |
| TW | 201339928 A | * | 10/2013 | ............. G06F 3/044 |
| WO | 2016180568 A1 | | 11/2016 | |

OTHER PUBLICATIONS

Gönen et al., "A Dynamic Zoom ADC With 109-dB DR for Audio Applications", IEEE Journal of Solid-State Circuits, vol. 52, No. 6, Jun. 2017, 9 pages.
International Search Report and Written Opinion in corresponding International Application No. PCT/EP2019/075914 dated Dec. 10, 2019, 13 pages.
Korean Notice of Allowance dated Jan. 30, 2023, KR Application No. 10-2021-7013107, 9 pages (including English translation).

* cited by examiner

CAPACITANCE TO DIGITAL CONVERTER, INTEGRATED SENSOR INTERFACE AND SENSOR DEVICE

CROSS-REFERENCE TO RELATED APPLICATIONS

The present application is the national stage entry of International Patent Application No. PCT/EP2019/075914, filed on Sep. 25, 2019, published as WO 2020/069941 A1 on Apr. 9, 2020, which claims benefit of priority of European Patent Application No. 18198139.0 filed on Oct. 2, 2018, all of which are hereby incorporated by reference in their entirety for all purposes.

FIELD OF THE INVENTION

The present disclosure relates to a capacitance to digital converter, e.g. for determining a capacitance value of a capacitive sensor element, to an integrated sensor interface with such a capacitance to digital converter and to a sensor device with such a capacitance to digital converter.

BACKGROUND OF THE INVENTION

Capacitive sensors may be used in many applications to measure physical or chemical quantities such as, for example, humidity or pressure. For example, a capacitance value of the capacitive sensor represents the physical or chemical quantity to be measured. For evaluating the sensor, capacitance to digital converters, CDCs, are used that perform a conversion from a capacitance value to a digital value.

In some conventional approaches, CDCs charge both the capacitive sensor and one or more reference capacitors with a common predefined voltage and determine the digital value from a relationship between the charges stored on the capacitive sensor and the reference capacitors. In such implementations, the one or more reference capacitors have a capacitance value that is equal or larger than the capacitance value to be measured. Hence, if large capacitances have to be measured, the one or more reference capacitors have to be provided with large capacitance values accordingly. For example, the reference capacitors are provided as external circuit elements matched to an expected capacitance value of a specific capacitive sensor application.

SUMMARY OF THE INVENTION

The present disclosure provides an improved measurement concept that allows a more flexible measurement of capacitive sensors.

The improved measurement concept is based on the knowledge that the charge that is stored on a capacitance depends on both the capacitance value and the voltage, with which the capacitance is charged. If the charges stored on the capacitive sensor and one or more reference capacitors are compared, the improved concept proposes to reduce the voltage, which is used for charging the capacitive sensor, which at the same time allows to reduce the capacitance value of reference capacitances charged with a higher voltage. Accordingly, it is not necessary according to the improved measurement concept that the reference capacitances have a larger capacitance value compared to the capacitive sensor.

For example, having a first and a second reference voltage for charging one or more reference capacitances of a reference block, these reference voltages can be downscaled to first and second downscaled voltages, which are used for charging the capacitive sensor. By respective processing a digital output signal can be determined based on a charge distribution between the capacitive sensor and the one or more reference capacitances of the reference block and based on a scaling factor used for the downscaling of the reference voltages. Hence this scaling factor, corresponding to the ratio between the unscaled and scaled reference voltages, is known in the processing and allows for ratiometric processing. The processing of the charges itself therefore is independent from actual values of the reference voltages.

The improved measurement concept, for example, allows integrating reference capacitances into an integrated circuit instead of providing them externally. The scaling factor may be chosen variably, for example depending on an expected capacitance value of the capacitive sensor. Hence, the same circuit may be used for different capacitive sensors.

With scaling the voltage pre-charged onto the sensor capacitance, the amount of charge stored on it can be scaled and, as a consequence, the range of the capacitive sensor can be expanded accordingly.

For example, a capacitance to digital converter, CDC, according to the improved measurement concept comprises a first and a second reference terminal for receiving a first and a second reference voltage. The first and the second reference voltage may be a positive and a negative supply voltage or voltages derived from such supply voltages. Alternatively, the first and the second reference voltage may be one reference voltage and a voltage corresponding to a base voltage like a ground potential.

The CDC further comprises a reference block comprising one or more reference charge stores and being coupled to the first and second reference terminals via a first switching block for selectively connecting the one or more reference charge stores to the first and second reference terminals. A scaling block provides at a third and a first reference terminal downscaled voltages from the first and second reference voltages depending on a scaling factor. The scaling factor may be chosen to be smaller than 1, whereas setting the scaling factor equal to 1 should generally not be excluded.

The CDC further comprises a first and a second measurement terminal for connecting a capacitive sensor element. The first measurement terminal is coupled to the third and fourth reference terminal via a second switching block for selectively receiving the downscaled voltage from at least one of the first and second reference voltages. For example, the first measurement terminal is provided with a first downscaled voltage from the first reference voltage or with a second downscaled voltage from the second reference voltage.

A processing block is coupled to the reference block and to the second measurement terminal and is configured to determine a digital output signal based on a charge distribution between the sensor element and the reference block and based on the scaling factor. The output signal represents a capacitance value of the sensor element. Hence, with adjusting the scaling factor to a specific application, i.e. a specific capacitive sensor allows having a CDC with a wide range of capacitive sensors, which are particularly not limited to sensors having a capacitance value being smaller than that of the reference block.

In various implementations, the CDC may have the processing block implemented with a sigma-delta analog-to-digital converter, ADC, or with a successive approximation register, SAR, ADC. Other implementations that are based on charge distribution are not excluded.

At least in the implementations mentioned, i.e. sigma-delta ADC or SAR ADC, the capacitive elements are operated in a switched fashion. For example, in various implementations the CDC is configured to connect, during a first phase, the first measurement terminal to the third reference terminal via the second switching block and, to connect, during a second phase, which is non-overlapping with the first phase, the first measurement terminal to the fourth reference terminal via the second switching block.

Accordingly, during the first phase, the first measurement terminal is provided with the first downscaled voltage and during the second phase with the second downscaled voltage.

For example, in some implementations of the CDC related to a sigma-delta ADC, the processing block comprises an integrator and a quantizer, which are part of a sigma-delta ADC. An input of the integrator is coupled to the reference block and to the second measurement terminal. The reference block at least partially is part of a feedback path of the sigma-delta ADC from an output of the quantizer to the input of the integrator. The first switching block is controlled based on a feedback signal in a feedback path. For example, the digital output signal depends on a charge distribution between the sensor element and the one or more reference charge stores in the feedback path of the sigma-delta ADC.

For example, the one or more reference charge stores of the reference block comprise at least one feedback charge store being switchably coupled, via the first switching block, at a first end to the input of the integrator and at a second end to the first and second reference terminals. This allows, for example, depending on the switching phase, to charge the one or more reference charge stores with the respective reference voltage associated with the feedback signal and to provide the stored charges to the integrator input during the second phase.

For example, the output value depends on a ratio between a capacitance value of the at least one feedback charge store and the capacitance value of the sensor element scaled with the scaling factor s. For example, there is a proportionality between the capacitance value Cs of the sensor element and the capacitance value Cref of the at least one feedback charge store that can be expressed like $$DOut \sim \frac{Cs \cdot s}{Cref},$$

wherein DOut represents a value of the digital output signal.

In some implementations, further capacitive elements may be included in the reference block that are not controlled based on a feedback signal but are switched with the first and the second phase. These additional reference charge stores may, for example, serve the purpose of generating a mean value that is subtracted during the integration process such that, for example, the digital output signal only represents deviations of the capacitive value of the sensor element from the mean value.

In various implementations of the sigma-delta ADC-based CDC, the CDC is configured to connect the second measurement terminal to a common mode terminal during a first phase and to the input of the integrator during the second phase. Furthermore, the CDC connects a first end of at least one of the one or more reference charge stores of the reference block to a common mode terminal during the first phase and to the input of the integrator during the second phase. Furthermore, the CDC connects the second end of the at least one of the one or more reference charge stores of the reference block either to the first reference terminal during the first phase and to the second reference terminal during the second phase, or to the second reference terminal during the first phase and to the first reference terminal during the second phase. The connection of the second end of the at least one of the one or more reference charge stores may depend on respective actual values of the feedback signal in the feedback path.

In an example implementation of the CDC employing an SAR approach, the processing block comprises a comparator and a SAR logic coupled to an output of the comparator. The second measurement terminal and the reference block are coupled to an input of the comparator. The input of the comparator is coupled to a common mode terminal during at least a part of the first phase. For example, the input of the comparator is not coupled to the common mode terminal during the second phase. The SAR logic is configured to control the first switching block during the second phase and to determine the output signal based on one or more comparison results of the comparator.

As mentioned before, the first measurement terminal is connected to the third reference terminal during the first phase and to the fourth reference terminal during the second phase. For example, the first phase corresponds to a reset phase or sampling phase of the capacitive sensor element while the second phase corresponds to a conversion phase during which the SAR logic performs the actual conversion of the charge sampled on the sensor element.

For example, each of the one or more reference charge stores of the reference block has a first end coupled to the input of the comparator and a second end connected to either the first or the second reference terminal depending on a control signal provided by the SAR logic.

For example, the one or more reference charge stores have a predefined ratio of their capacitance values with each other, such that controlling the switching block with an output of the SAR logic allows approximating the sampled charge of the capacitive sensor element with the charges stored on the reference charge stores. For example, the one or more reference charge stores may be binary weighted.

The concept of using downscaled voltages for charging capacitances can also be employed for the charging of the one or more reference charge stores of the reference block. For example, the CDC further comprises a further scaling block for providing further downscaled voltages of the first and second reference voltages at fifth and sixth reference terminals depending on a further scaling factor. Each of the one or more reference charge stores of the reference block has a first end coupled to the input of the comparator and second end connected to either the fifth or the sixth reference terminal depending on a control signal provided by the SAR logic. In this way the range of the CDC is extended to sense small values of the capacitive sensor element with high resolution. For example, this can be used if an expected capacitance value of the sensor element is smaller than a nominal value that can be achieved if both the scaling factor and the further scaling factor were set to 1. By the further scaling factor, the maximum capacitance value to be sensed can be downscaled such that the dynamic range of the CDC is used more efficiently.

In contrast, with the scaling factor applied at the sensor element, the nominal value of a maximum capacitance to be sensed with the CDC is up-scaled, e.g. with an inverse proportionality to the scaling factor.

For example, each of the one or more reference charge stores of the reference block has a predefined scaling with respect to a reference capacitance value. Hence the output value depends on a ratio between the reference capacitance value and the capacitance value of the sensor element scaled with the scaling factor.

In the various implementations of the CDC described above, the scaling factor can be set in different ways. For example, the scaling factor can be set by programming via a programing interface of the CDC. For example, if a maximum capacitance value that can be sensed is known for a scaling factor assumed to 1, and expected capacitance values of the sensor element are known, a scaling factor $s \leq 1$ can be chosen accordingly, e.g. with respect to dynamic range and/or headroom, and programmed via the programming interface accordingly. In other implementations, the scaling factor s may be predefined, such that a static nominal value for the maximum capacitance value to be sensed results. This may be, for example, appropriate if the CDC is designed for a specific application, i.e. a specific capacitive sensor only.

In a further implementation, the scaling factor is set by a calibration procedure taking into account an actual value of a capacitive sensor element connected to the first and second measurement terminals. For example, during the calibration procedure, various scaling factors are chosen for measuring the capacitance value of the sensor element, and one scaling factor is chosen for the actual setting depending on some kind of rating. For example, a selection is made based on dynamic range and headroom.

The downscaled voltages can be generated with some kind of fixed or programmable voltage divider or at least based on voltage division. In other implementations the switching block comprises a digital-to-analog converter for providing the downscaled voltages at the third and fourth reference terminals depending on the scaling factor. For example, this scaling factor is provided as a digital signal word to the scaling block, or is stored within the scaling block.

According to the improved measurement concept, an integrated sensor interface comprises a CDC according to one of the implementations described above. For example, the integrated sensor interface includes the CDC with the reference block and the respective one or more reference charge stores integrated into a single integrated circuit. The sensor interface that may be implemented as an interface chip, for example, has external terminals for providing connection to the first and second measurement terminals, i.e. for connecting an external capacitive sensor element. Furthermore, the sensor interface may feature respective terminals for providing the digital output signal and, depending on the implementation, terminals for controlling and/or programming the sensor interface, e.g. for setting the scaling factor.

An example of the sensor device according to the improved measurement concept comprises a CDC according to one of the implementations described above and the capacitive sensor element that is configured for measuring a physical or chemical quantity. The physical or chemical quantity may be a pressure, a humidity, a gas concentration, a dew point, acceleration, tilt, angle, inclination, position, force, a level of a liquid or other fluid or fluidized solids. However, other quantities to be measured by way of a capacitive value are not excluded by this enumeration. For example, the capacitive sensor element may be part of a gyroscopic sensor.

In some implementations, the sensor device further comprises a radio frequency identification, RFID, circuit for transmission of data associated with the capacitive sensor element. For example, the RFID circuit contributes to the power supply of the sensor device. In various applications, the capacitive sensor element could also be a capacitive MEMS microphone.

Various implementations of the integrated sensor interface and sensor devices as described above could be used as or in smart home appliances or internet of things, IoT, devices. Furthermore, the sensor interface and/or the sensor device could be used in mobile devices like mobile phones, tablets, notebooks or other handheld devices.

The improved measurement concept allows to create a cost effective standard product, which enables to use it for wide measurement ranges whereas keeping the cost of the device low. For example, integrating very large capacitors is not necessary.

BRIEF DESCRIPTION OF THE DRAWINGS

In the following, the improved measurement concept is explained in detail with the aid of exemplary implementations by reference to the drawings. Components that are functionally identical or have an identical effect may be denoted by identical references. Identical components and/or components with identical effects may be described only with respect to the figure where they occur first; their description is not necessarily repeated in subsequent figures.

In the drawings.

DETAILED DESCRIPTION

Figure 1:
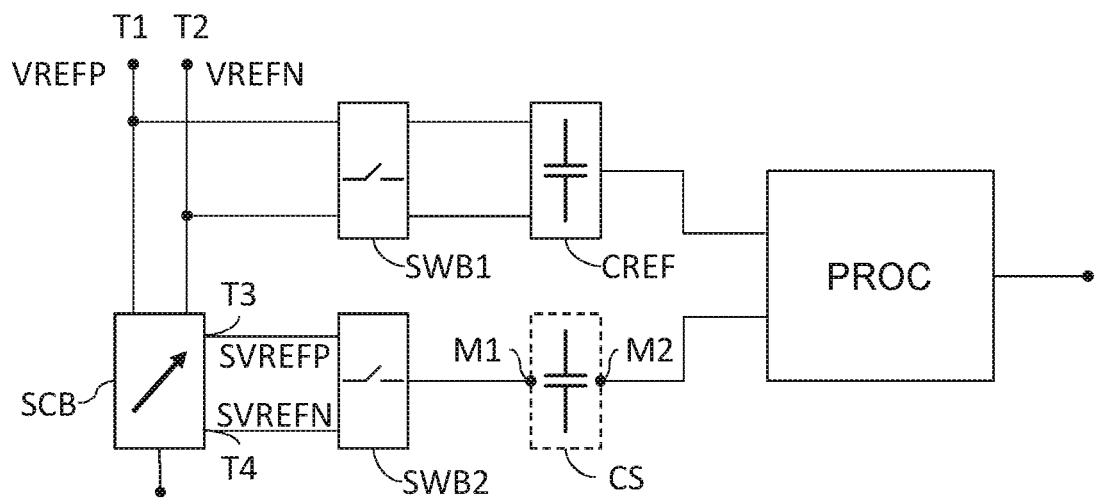
FIG. 1 shows a schematic representation of an example implementation of a capacitance to digital converter with a capacitive sensor element according to the improved measurement concept.

FIG. 1 shows an example implementation of a capacitance to digital converter, CDC, with a processing block PROC for determining a digital output signal representing a capacitance value of a capacitive sensor element CS. The determination of the output signal is based on a charge distribution between the sensor element CS and of a reference block CREF. The sensor element CS is may or may not be part of the CDC.

The CDC has a first reference terminal T1 and a second reference terminal T2 for receiving a first and a second reference voltage VREFP, VREFN, respectively. The reference block CREF that comprises one or more reference charge stores is coupled to the first and second reference terminals T1, T2 via a first switching block SWB1. This allows selectively connecting the one or more reference charge stores to the reference terminals T1, T2.

A scaling block SCB is connected to the first and second reference terminals T1, T2 at an input side and features a third and a fourth reference terminal T3, T4 at an output side. The scaling block SCB is configured to provide respective downscaled voltages SVREFP, SVREFN at the third and fourth reference terminals T3, T4 from the first and second reference voltages VREFP, VREFN at the first and second reference terminals T1, T2. The downscaling of the reference voltages VREFP, VREFN is based on a scaling factor that is in the range between 0 and 1. The downscaling may be performed based on voltage division, for example directly with a voltage divider or based on a voltage divider. In some implementations, the scaling block SCB comprises a digital-to-analog converter, DAC, for providing the downscaled voltages SVREFP, SVREFN at the third and fourth reference terminals T3, T4 depending on the scaling factor. For example, the reference voltages VREFP, VREFN serve as a supply for such a digital-to-analog converter. The scaling factor may be provided as a digital scaling word or the like to the digital-to-analog converter, or may be stored in the scaling block SCB.

The sensor element CS is connected between a first and a second measurement terminal M1, M2. The first measurement terminal M1 is connected to the third and the fourth reference terminals via a second switching block SWB2. This allows selectively receiving the downscaled voltages SVREFP, SVREFN from the third and fourth reference terminals T3, T4 at the first measurement terminal M1. The second measurement terminal M2 is coupled to an input of the processing block PROC. A further input of the processing block PROC is coupled to the reference block CREF. This coupling is shown as a simple connection for reasons of a better overview, but can include one or more individual connections, depending on the actual implementation of the CDC.

As mentioned above, the determination of the digital output value is based on a charge distribution between the sensor element CS and the reference block CREF. During operation of the CDC the one or more charge stores of the reference block CREF are charged with the reference voltages VREFP, VREFN and the sensor element CS is charged with the downscaled voltages SVREFP, SVREFN. Hence, the charge stores of the reference block CREF can be made smaller, i.e. having smaller capacitance values by the same factor as the downscaled voltages SVREFP, SVREFN are smaller than the reference voltages VREFP, VREFN. Hence, in comparison with conventional approaches, where both reference charge stores and the capacitive sensor element are charged with the same voltages, using the downscaled voltages SVREFP, SVREFN for the sensor element CS allows measuring of capacitance values that are larger than the reference charge stores. This is, for example, based on the idea that the charge stored on a charge store depends both on the capacitance value and the charging voltage.

The CDC can be implemented with several approaches for processing in a processing block PROC, two of which will be described below in more detail. For example, an approach using sigma-delta analog-to-digital conversion is explained in detail in conjunction with FIGS. 2 to 4. An approach using the principle of successive approximation with a successive approximation register, SAR, is described in conjunction with FIGS. 5 to 8.

Figure 2:
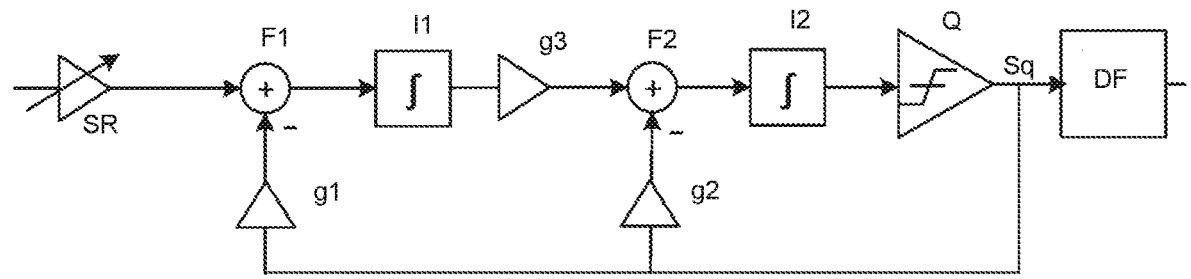
FIG. 2 shows an example implementation of a CDC according to the improved measurement concept with a sigma-delta conversion approach.

Referring now to FIG. 2, an example implementation of a CDC according to the improved measurement concept is shown. A sensor representation SR including the capacitive sensor element CS having a variable capacitance value is shown at the input of the CDC, which is implemented as a sigma-delta ADC.

Figure 4:
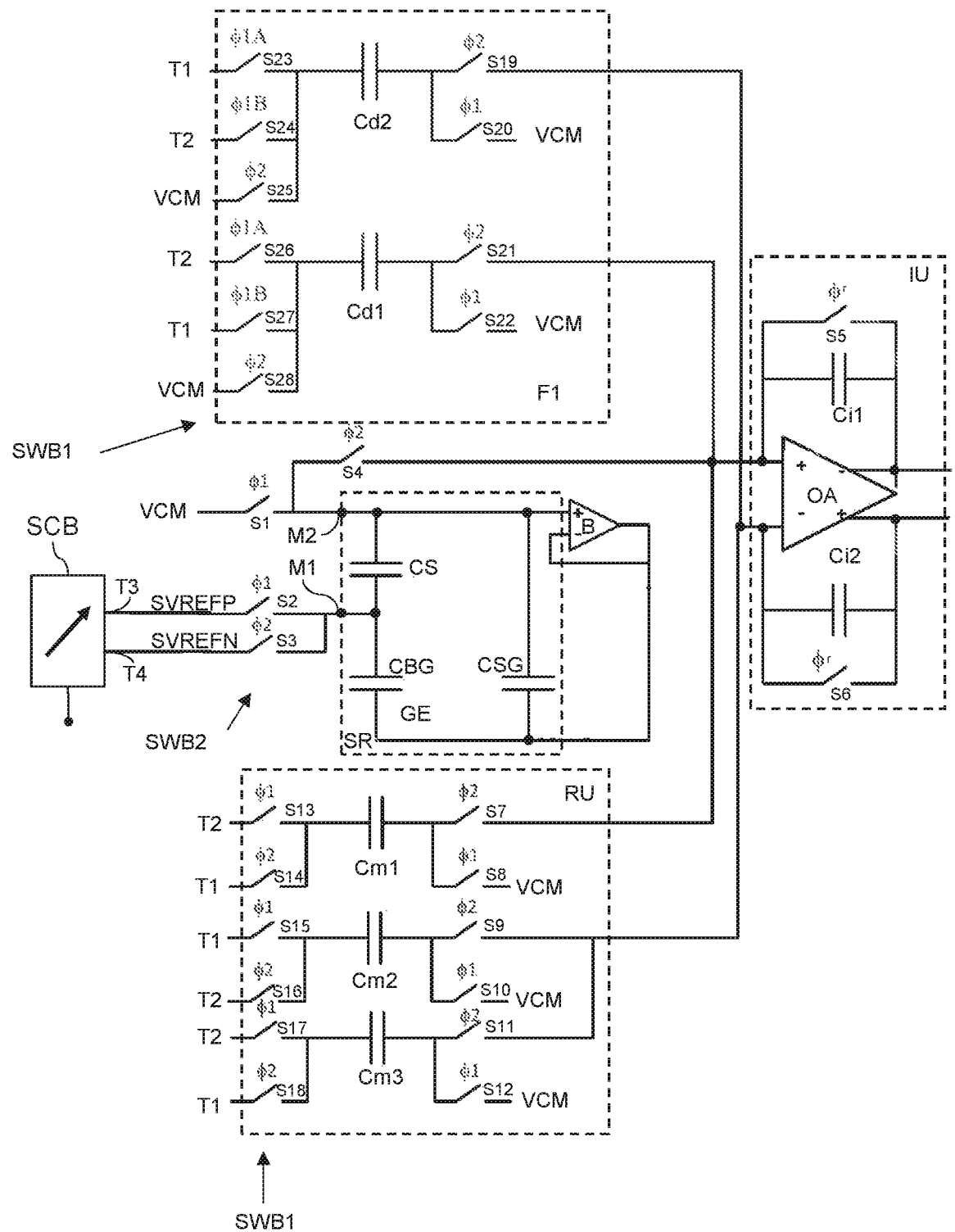
FIG. 4 shows a detail of a CDC according to the improved measurement concept relating to the implementation of FIG. 2.
Figure 5:
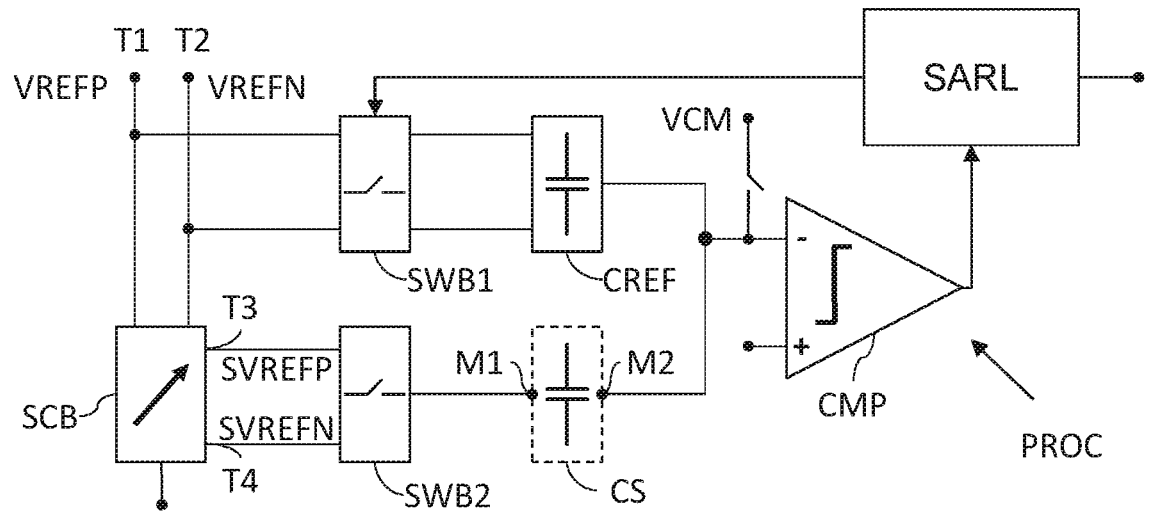
FIG. 5 shows a schematic representation of an example implementation of a CDC employing an SAR approach.

A first feedback circuit F1 is present at the input of the CDC. For example, the sensor representation SR and further elements of FIG. 5 are implemented as shown in FIG. 4, which will be discussed below in more detail. The CDC further comprises a first integrator I1 connected downstream of the first feedback circuit F1, the first integrator I1 comprising e.g. an integration unit IU as shown in FIG. 4. The CDC further comprises a second integrator I2 connected to an output of the first integrator I1 and a second feedback circuit F2 connected between the first and the second integrator I1, I2. The second feedback circuit F2 may for example be implemented analogously to the first feedback circuit F1. The CDC further comprises a quantizer Q connected to an output of the second integrator I2 and an optional filter DF connected to an output of the quantizer Q. The filter DF may for example be implemented as a digital filter, e.g., as a digital low-pass filter. Furthermore, the output of the quantizer Q is also connected to the first and second feedback circuit F1, F2.

Furthermore, weighting factors g1, g2, g3 are indicated between the first feedback circuit F1 and the quantizer Q, between the second feedback circuit F2 and the quantizer Q and between the first integrator I1 and the second feedback circuit F2, respectively. The weighting factors g1, g2, g3 may for example depend on capacitance values of the CDC, for example on the capacitances of the capacitive sensor element CS, reference capacitors Cm1, Cm2, Cm3, and/or integration capacitors Cd1, Cd2, which are only shown in FIG. 4.

In operation, the sensor representation SR is used as a sampling stage for the CDC. That is, charge is stored on the capacitive sensor element CS and read out via the second measurement terminal M2, as described generally with respect to FIG. 1.

Referring now to FIG. 4, it shows a detail of the example implementation of the CDC of FIG. 2.

The sensor element CS is part of the sensor representation SR and connected between the first and the second measurement terminal M1, M2. The additional capacitive elements CBG, CSG of the sensor representation SR represent parasitic capacitances between the two terminals of the capacitive sensor element and a common electrode GE. A buffer element B that may be implemented as an operational amplifier, for example, serves the purpose of driving a voltage at the common electrode GE to be equal or approximately equal to a voltage applied at the second measurement terminal M2. This is, for example, disclosed in more detail in international publication WO 2016/180568 A1, which is hereby incorporated by reference in its entirety.

The upper terminal of the capacitive sensor element CS is connected, via the second measurement terminal M2, to a common mode terminal VCM via a switch S1. The lower electrode of the capacitive sensor element CS is connected, via the first measurement terminal M1, to the third reference terminal T3 via a switch S2 and to the fourth reference terminal T4 via a switch S3. The CDC also comprises the integration unit IU and a reference unit RU.

The integration unit IU comprises a first integration input connected to the second measurement terminal M2 via a switch S4 and to the reference unit RU and a second integration input connected to the reference unit RU.

Furthermore, the integration unit IU comprises an operational amplifier OA with a non-inverting input connected to the first integration input, an inverting input connected to the second integration input, an inverting output connect to the first integration output and a non-inverting output connected to the second integration output. The integration unit IU comprises a first integration capacitor Ci1 connected between the first integration input and the first integration output and a second integration capacitor Ci2 connected between the second integration input and the second integration output. Moreover, the integration unit IU comprises switches S5, S6 for shorting the first and the second integration capacitor Ci1, Ci2.

The reference unit RU comprises a first reference capacitor Cm1 with a first plate connected to the first integration input via a switch S7 and to the common mode terminal VCM via a switch S8. A second plate of the first reference capacitor Cm1 is connected to the first reference terminal T1 via a switch S14 and to the second reference terminal T2 via a switch S13. The reference unit RU comprises a second reference capacitor Cm2 with a first plate connected to the second integration input via a switch S9 and to the common mode terminal VCM via a switch S10. A second plate of the second reference capacitor Cm2 is connected to the first reference terminal T1 via a switch S15 and to the second reference terminal T2 via a switch S16. The reference unit RU comprises a third reference capacitor Cm3 with a first plate connected to the second integration input via a switch S11 and to the common mode terminal VCM via a switch S12. A second plate of the second reference capacitor Cm2 is connected to the first reference terminal T1 via a switch S18 and to the second reference terminal T2 via a switch S17.

The reference capacitors Cm1, Cm2, Cm3 may be part of the reference block CREF.

The switches S1, S2, S5, S6, S8, S10, S12, S13, S15, S17 may be controlled by a first switch signal $\Phi 1$, in particular may be closed if the first switch signal $\Phi 1$ is logic high and opened if the first switch signal $\Phi 1$ is logic low. On the other hand, the switches S3, S4, S7, S9, S11, S14, S16, S18 may be controlled by a second switch signal $\Phi 2$, in particular may be closed if the second switch signal $\Phi 2$ is logic high and opened if the second switch signal $\Phi 2$ is logic low.

Figure 3:
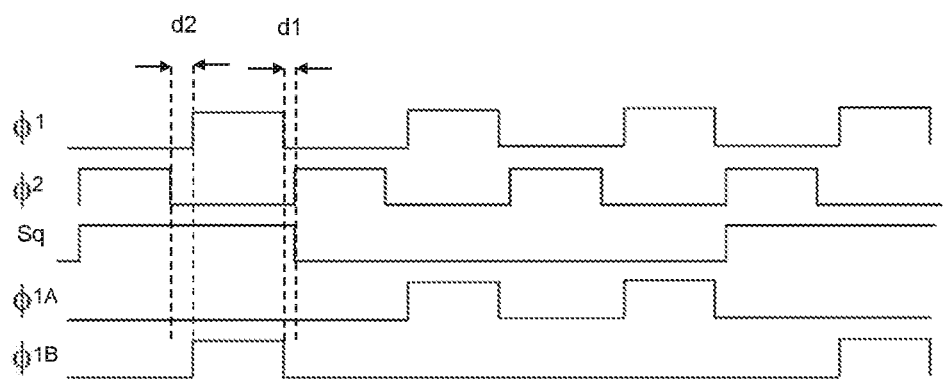
FIG. 3 shows an example signal time diagram of signals that may be present in a CDC with the sigma-delta conversion approach.

For a timing of the first and the second switch signal $\Phi 1$, $\Phi 2$, it is referred to FIG. 3. In particular, the first and the second switch signal $\Phi 1$, $\Phi 2$ may for example not be logic high at the same time. $\Phi 1$ may refer to a first phase and $\Phi 2$ may refer to a second phase.

In addition, the CDC of FIG. 4 comprises the first feedback circuit F1 connected to the first and the second integration input. The first feedback circuit F1 comprises a first feedback capacitor Cd1 with a first plate connected to the first integration input via a switch S21 and to the common mode terminal VCM via a switch S22. A second plate of the first feedback capacitor Cd1 is connected to the first reference terminal T1 via a switch S27, to the second reference terminal T2 via a switch S26 and to the common mode terminal VCM via a switch S28. The first feedback circuit F1 comprises a second feedback capacitor Cd2 with a first plate connected to the second integration input via a switch S19 and to the common mode terminal VCM via a switch S20. A second plate of the second feedback capacitor Cd2 is connected to the first reference terminal T1 via a switch S23, to the second reference terminal T2 via a switch S24 and to the common mode terminal VCM via a switch S25.

The first feedback capacitor Cd1 and the second feedback capacitor Cd2 are part of the reference block CREF and act as feedback charge stores.

The switches S20 and S22 may be controlled by the first switch signal $\Phi 1$, in particular may be closed if the first switch signal $\Phi 1$ is logic high and opened if the first switch signal $\Phi 1$ is logic low. The switches S19, S21, S25, S28 may be controlled by the second switch signal $\Phi 2$, in particular may be closed if the second switch signal $\Phi 2$ is logic high and opened if the second switch signal $\Phi 2$ is logic low. The switches S23 and S26 may be controlled by a first feedback signal $\Phi 1A$, in particular may be closed if the first feedback signal $\Phi 1A$ is logic high and opened if the first feedback signal $\Phi 1A$ is logic low. The switches S24 and S27 may be controlled by a second feedback signal $\Phi 1B$, in particular may be closed if the second feedback signal $\Phi 1B$ is logic high and opened if the second feedback $\Phi 1B$ is logic low.

Switches S13, S14, S15, S16, S17, S18, S19, S20, S21, S22, S23, S24, S26 and S27 are comprised by the first switching block SWB1. Switches S2 and S3 are comprised by the second switching block SWB2.

For a timing of the first and the second feedback signal $\Phi 1A$, $\Phi 1B$, it is referred to FIG. 3.

By means of the first feedback circuit F1, the sensor circuit may effectively subtract a signal from the sense signal. The signal subtracted from the sense signal may for example be generated from another component of the integrator circuit, the CDC and/or the sigma-delta-modulator. For example, the switches S23, S24, S26 and S27 of the first switching block SWB1 are controlled based on a feedback signal in a feedback path from the quantizer output.

In operation, when the first switch signal $\Phi 1$ is logic high, the second measurement terminal M2 is connected to the common mode terminal VCM and the first measurement terminal M1 is connected to the third reference terminal T3 for storing a charge on to the capacitive sensor element CS using the downscaled voltage SVREFP provided by the scaling block SCB.

The amount of charge stored depends both on the downscaled voltage SVREFP and on the capacity of the capacitive element CS, and therefore on the physical or chemical quantity to be measured. Then, when the second switch signal $\Phi 2$ is logic high, the first measurement terminal M1 is connected to the fourth reference terminal T4 for receiving the downscaled voltage SVREFN provided by the scaling block SCB, and the second measurement terminal M2 is connected to the first integration input. Therefore, a sense signal corresponding to the charge stored on the capacitive element CS is applied to the first integration input. Consequently, the integration unit IU, in particular the operational amplifier OA, generates a first output voltage at the first integration output and a second output voltage at the second integration output depending on the sense signal. The first and the second output voltage depend on the charge stored on the capacitive element CS, and therefore on the physical or chemical quantity to be measured.

The capacitance of the reference capacitors Cm1, Cm2, Cm3 is for example adjusted to a reference capacitance. E.g., the reference capacitance may correspond to a mean value of the capacitance of the capacitive sensor element CS. For example, depending on the physical or chemical quantity to be measured, the capacitance of the capacitive sensor element CS may lie between a minimum value and a maximum value of the capacitance. Then, the capacitance of the reference capacitors Cm1, Cm2, Cm3 may be a mean value of the minimal value and the maximum value.

Due to the described connection and switching of the reference unit RU, the sense signal is adjusted with respect to a reference value corresponding to the reference capacitance, that is for example to the mean value of the capacitance of the capacitive sensor element CS.

The first and the second integration capacitor Ci1, Ci2 may for example be shorted by means of the first switch signal Φ1 every time charge is being stored on the capacitive sensor element CS.

In FIG. 4, the first and the second integration capacitor Ci1, Ci2 may be controlled by a reset signal Φr for example instead of being controlled by the first switch signal Φ1. The reset signal Φr may for example be logic high to short the first and the second integration capacitor Ci1, Ci2 at specified instances of operation of the CDC.

Referring back to FIG. 2, the first integrator I1 generates a first integrated signal based on the first and the second output voltage of the sensor circuit. Therein, the sense signal generated by the sensor circuit by reading out the charge may be adjusted by means of the first feedback circuit F1 as described before.

Then, the first integrated signal is weighted by means of the third weighting factor g3 and adjusted by means of the second feedback circuit F2 analogously as described with respect to the first feedback circuit F1. The weighted and adjusted first integration signal is fed to the second integrator I2, which generates a second integrated signal based thereupon. The second integrated signal is fed to the quantizer Q, which generates a quantized signal Sq based on the second integrated signal, and therefore also based on the first integrated signal and the first and second output voltage of the sensor circuit, respectively.

The quantized signal Sq is correspondingly weighted by the first and the second weighting factor g1, g2 is then fed back to the first and the second feedback circuit F1, F2, respectively. The quantized signal Sq may also be fed to the filter DF, which generates a filtered output signal based thereupon, e.g. a digital output signal. An output bit stream corresponding to the digital output signal is indicative and/or may be proportional to the physical or chemical quantity to be measured.

The first and the second feedback signal Φ1A, Φ1B may for example be generated based on the quantized signal Sq, as explained with respect to FIG. 3.

FIG. 3 schematically shows the first and the second switch signal Φ1, Φ2, the quantized signal Sq, as well as the first and the second feedback signal Φ1A, Φ1B as a function of time. The first switch signal Φ1 may for example be derived from a clock signal and may feature specified periods of logic high and specified periods of logic low. In the shown example, the periods of logic high of the first switch signal Φ1 are for example shorter than the periods of logic low of the first switch signal. The second switch signal Φ2 may for example always be logic low whenever the first switch signal Φ1 is logic high and may be logic low only during periods when the first signal Φ1 is logic low. E.g., every falling edge of the first switch signal Φ1 may be followed by a rising edge of the second switch signal Φ2 after a first delay d1 and every falling edge of the second switch signal Φ2 may be followed by a rising edge of the first switch signal Φ1 after a second delay d2.

The first feedback signal Φ1A may for example correspond to the first switch signal Φ1 whenever the quantized signal Sq is logic low and be logic low otherwise. The second feedback signal Φ1B may for example correspond to the first switch signal Φ1 whenever the quantized signal Sq is logic high and be logic low otherwise.

Due to the different charging voltages for the capacitive sensor element CS, namely voltages SVREFP, SVREFN, and for the feedback charge stores Cd1, Cd2 and reference capacitors Cm1, Cm2, Cm3, namely the reference voltages VREFP, VREFN, the digital output value not only depends on the actual capacitance values but also on the scaling factor applied by the scaling block SCB for generating the downscaled voltages SVREFP, SVREFN from the reference voltages VREFP, VREFN. For example, the digital output signal DOut is proportional to the ratio of the capacitance value Cs of the capacitive sensor element CS scaled with the scaling factor s to the capacitance value Cref of the feedback charge stores Cd1, Cd2, which for example at least nominally have the same capacitance value. This can be represented by $$DOut \sim \frac{Cs \cdot s}{Cref}.$$

Taking into account also the reference charge stores Cm1, Cm2, Cm3, which serve to adjust the output value with respect to a reference value like a mean value, the digital output signal can be represented as $$DOut \sim \frac{Cs \cdot s - Cm}{Cref},$$

where Cm is the capacitance value of the reference charge stores Cm1, Cm2, Cm3. DOut may be further proportional to a bit-length N of the digital output signal.

In some implementations, respective chopping elements can be introduced before and after the integration unit IU.

It should be apparent to the skilled reader that the CDC with the sigma-delta ADC-based structure could be implemented with either a single feedback circuit F1 or with more than two feedback circuits F1, F2 without departing from the general approach for a feedback and with different charging voltages as described in conjunction with FIG. 4.

Referring now to FIG. 5, an implementation of the CDC using an SAR approach is shown. Generally, the implementation of FIG. 5 is based on the implementation shown in FIG. 1. However, in a specific implementation of FIG. 5, the processing block PROC comprises a comparator CMP and an SAR logic SARL coupled to an output of the comparator CMP. The comparator CMP comprises a first input, for example a non-inverting input for providing a comparison voltage, to which an input voltage at a second input of the comparator CMP can be compared. The second input may be an inverting input. The second measurement terminal M2 is connected to the second input of the comparator CMP. Furthermore, the reference block CREF has an output coupled to the second comparator input. In addition, the second comparator input is selectively coupled to a common mode terminal VCM. The SAR logic SARL has an output for providing the digital output signal and a control output for controlling respective switches of the first switching block SWB1.

During a first switching phase, which may be a reset or sampling phase, the capacitive sensor element CS is connected to the third reference terminal for charging the sensor element with the first downscaled voltage SVREFP. Furthermore, at least during a part of the first switching phase the common mode terminal VCM is connected to the second comparator input. During a second phase, which is a conversion phase, the SAR logic SARL controls the first switching block SWB1 for successively approximating the charge of the reference block CREF to the charge of the sensor element CS. The first measurement terminal M1 is connected to the fourth reference terminal for receiving the second downscaled voltage SVREFN during the second phase.

As the reference charge stores of the reference block CREF are charged with higher voltages compared to the sensor element CS, a smaller reference capacitance value can be chosen with respect to an expected capacitance value of the sensor element CS. For example, the reference charge stores of the reference block have a predefined scaling with respect to the reference capacitance value, such that the digital output value depends on a ratio between the reference capacitance value and the capacitance value of the sensor element scaled with the scaling factor.

Figure 6:
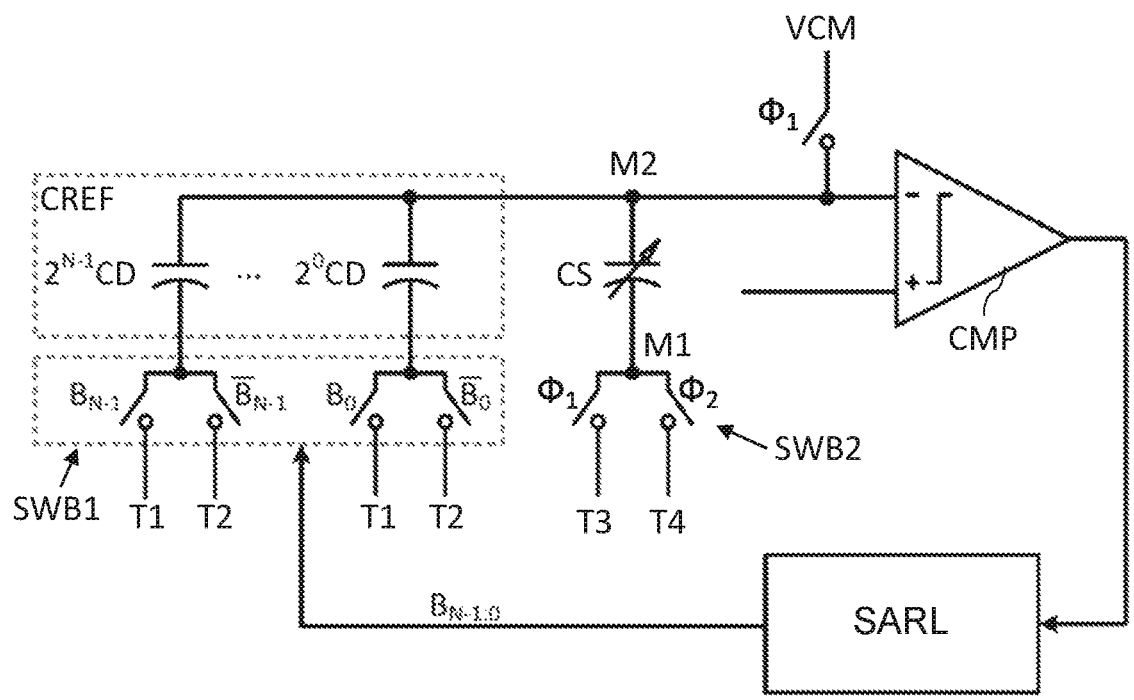
FIG. 6 shows an example implementation detail of the CDC with the SAR approach of FIG. 5.

Referring now to FIG. 6, an example implementation of the schematic representation of the SAR-based CDC is shown. For example, the reference block CREF comprises the reference charge stores having a defined scaling to a reference capacitance value CD, which is a binary scaling in this example. Each of the reference charge stores has one terminal connected to the second comparator input and the respective other terminal connected to the first and the second reference terminal T1, T2 by complementary controlled switches. For example, the SAR logic SARL provides respective bit values to the first switching block SWB1 which controls for each reference charge store individually whether it actually is connected to the first or to the second reference terminal T1 or T2. The first measurement terminal M1 is switchably connected to the third and the fourth reference terminals, wherein during a phase $\Phi 1$ the first measurement terminal M1 is connected to the third reference terminal T3 and during a phase $\Phi 2$, measurement terminal M1 is connected to the fourth reference terminal 14.

Figure 7:
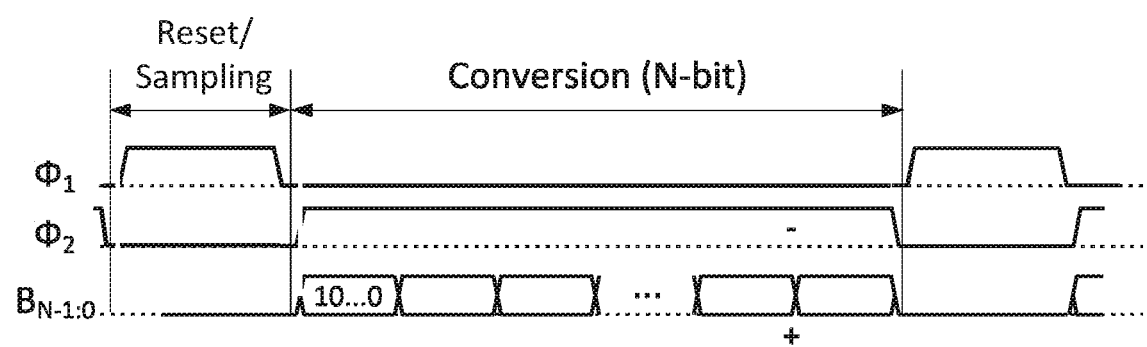
FIG. 7 shows an example timing diagram for signals that can be used in the implementation of FIG. 6.

Referring now to FIG. 7, a switching scheme for the implementation of FIG. 6 is shown. During a reset or sampling phase the signal $\Phi 1$ has a high level, thus closing the switch between M1 and T3. In the following conversion phase the signal $\Phi 2$ is logic high such that the switch between terminals M1 and 14 is closed. The switching signals $\Phi 1$ and $\Phi 2$ are non-overlapping. After the conversion phase, the process starts again with a sampling phase followed by a further conversion phase and so on. During the conversion phase, the SAR logic SARL controls the first switching block SWB1 to approximate the charge stored on the capacitive sensor element CS with respective charging of the reference charge stores of the reference block CREF. For example, for each bit of a desired output word, a comparison with a respective switch setting in the switching block SWB1 is performed.

Assuming a conventional implementation of a SAR-based CDC, where the capacitive sensor is charged with the same reference voltages as the reference charge stores in the reference block CREF, the maximum capacitance value of the sensor element is limited by the value of the reference capacitance value. By downscaling the reference voltages the measurement range is extended with an inverse proportionality to the scaling factor, assuming the same reference capacitance value. Moreover, by choosing the scaling factor appropriately, a dynamic range of the CDC can be utilized.

The scaling effect can also be used in the other direction. For example, referring now to FIG. 8, the implementation shown in FIG. 5 can be further extended by additionally providing a second scaling block SCB2 that, independently from the first scaling block SCB, provides further downscaled voltages SVREFP2, SVREFN2 at fifth and sixth reference terminals T5, T6. Hence, instead of selectively connecting the reference charge stores to the first and the second terminal T1, T2, in the implementation of FIG. 8 the reference charge stores are connected to terminals T5 and T6 by means of the first switching block SWB1. Besides the differing charging voltages for the reference charge stores of the reference block CREF, the switching scheme remains the same as described in conjunction with FIGS. 5 to 7.

Employment of the second scaling block SCB2 has the effect that less voltage is applied to the reference charge stores, thereby effectively reducing the maximum capacitance value to be sensed for a capacitive sensor. Hence, if for example capacitive sensors with small capacitance values, for example small with respect to the reference capacitance value of the reference block CREF, are to be sensed, the dynamic range of the CDC can be adapted thereto by choosing an appropriate further scaling factor controlling the second scaling block SCB2.

Figure 8:
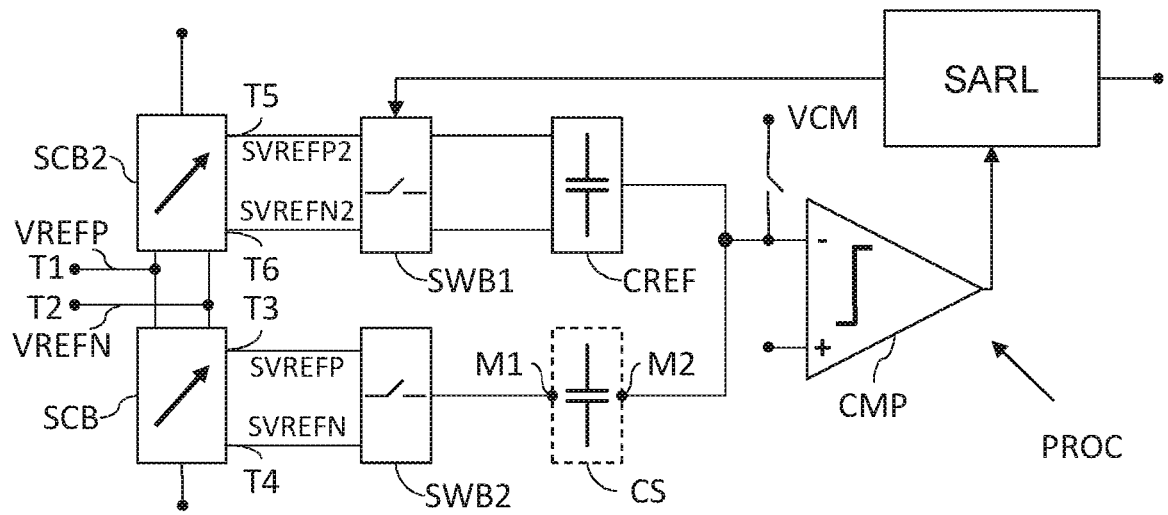
FIG. 8 shows a further implementation of a CDC employing an SAR approach.

In all of the implementations of the CDC described above, the scaling factor or, in the case of the implementation of FIG. 8, the scaling factors, can be set by a fixed setting which, for example, is chosen according to known properties of the capacitive sensor element to be connected to the CDC. In addition or as an alternative, the setting could be provided by programming via a programming interface of the CDC. This requires slightly more effort but makes the CDC more flexible to use. This may be particularly useful if the CDC is implemented in a sensor interface, for example an integrated sensor interface which can be used with a variety of different capacitive sensor elements having different applications and expected capacitive ranges.

Another option is to set the scaling factor by a calibration procedure taking into account an action value of a capacitive sensor element connected to the first and second measurement terminals M1, M2. For example, by varying the scaling factor, an optimal setting can be found that takes into account the actual value of the capacitive sensor element and a dynamic range that can be achieved with the scaling factor.

As previously mentioned, one effect of using the downscaled voltages for charging the capacitive sensor element is that smaller capacitance values can be used in the reference block CREF. This allows integrating the reference charge stores of the reference block into an integrated circuit while maintaining a reasonable measurement range. Further, only a small silicon area is needed for such integration due to the reduced capacitance values. Therefore the use of external reference capacitors can be avoided. In some applications, a CDC according to one of the implementations described above can be combined with a capacitive sensor element to form a sensor device. The capacitive sensor element is configured for measuring a physical or chemical quantity such as a pressure, a humidity, a gas concentration, a dew point, acceleration, tilt, angle, acceleration, inclination, position, force, a level of a liquid or other fluid or fluidized solids. However, other quantities to be measured by way of a capacitive value are not excluded by this enumeration.

Such a sensor device may further comprise an RFID circuit for transmission of data associated with the capacitive sensor element, for example the digital output signal or a value representing a physical or chemical quantity as measured by the sensor element. The RFID circuit may contribute to the power supply of the sensor device. For example, ultra-low power sensor devices can be fabricated this way.

Such integrated sensor interfaces or sensor devices can be used in various electronic devices like smart home appliances or IoT devices or mobile phones, tablets, notebooks or other handheld devices or other applications for consumer, industrial and automotive markets.

The invention claimed is:

1. A capacitance to digital converter, CDC, comprising:
a first and a second reference terminal for receiving a first and a second reference voltage;
a reference block comprising one or more reference charge stores and being coupled to the first and second reference terminals via a first switching block for selectively connecting the one or more reference charge stores to the first and second reference terminals;
a scaling block for providing at a third and a fourth reference terminal downscaled voltages from the first and second reference voltages depending on a scaling factor;
a first and a second measurement terminal for connecting a capacitive sensor element, the first measurement terminal being coupled to the third and fourth reference terminals via a second switching block for selectively receiving the downscaled voltage from at least one of the first and second reference voltages; and
a processing block coupled to the reference block and to the second measurement terminal and being configured to determine a digital output signal based on a charge distribution between the sensor element (CS) and the reference block and based on the scaling factor, the output signal representing a capacitance value of the sensor element (CS).

2. The CDC according to claim 1, wherein the scaling factor is smaller than 1.

3. The CDC according to claim 1, wherein the CDC is configured
to connect, during a first phase, the first measurement terminal to the third reference terminal via the second switching block; and
to connect, during a second phase, which is non-overlapping with the first phase, the first measurement terminal to the fourth reference terminal via the second switching block.

4. The CDC according to claim 3, wherein
the processing block comprises an integrator and a quantizer, which are part of a sigma-delta analog-to-digital converter, ADC;
an input of the integrator is coupled to the reference block and to the second measurement terminal;
the reference block at least partially is part of a feedback path of the sigma-delta ADC from an output of the quantizer to the input of the integrator; and
the first switching block is controlled based on a feedback signal in the feedback path.

5. The CDC according to claim 4, wherein the one or more reference charge stores of the reference block comprise at least one feedback charge store being switchably coupled, via the first switching block, at a first end to the input of the integrator and at a second end to the first and second reference terminals.

6. The CDC according to claim 5, wherein the output value depends on a ratio between a capacitance value of the at least one feedback charge store and the capacitance value of the sensor element scaled with the scaling factor.

7. The CDC according to claim 4, wherein the CDC is configured to connect the second measurement terminal to a common mode terminal during the first phase and to the input of the integrator during the second phase;
to connect a first end of at least one of the one or more reference charge stores of the reference block to the common mode terminal during the first phase and to the input of the integrator during the second phase; and
to connect a second end of the at least one of the one or more reference charge stores of the reference block
either to the first reference terminal during the first phase and to the second reference terminal during the second phase;
or to the second reference terminal during the first phase and to the first reference terminal during the second phase.

8. The CDC according to claim 3, wherein
the processing block comprises a comparator and a successive approximation register, SAR, logic coupled to an output of the comparator;
the second measurement terminal and the reference block are coupled to an input of the comparator;
the input of the comparator is coupled to a common mode terminal during at least a part of the first phase; and
the SAR logic is configured to control the first switching block during the second phase and to determine the output signal based on one or more comparison results of the comparator.

9. The CDC according to claim 8, wherein each of the one or more reference charge stores of the reference block has a first end coupled to the input of the comparator and a second end connected to either the first or the second reference terminal depending on a control signal provided by the SAR logic.

10. The CDC according to claim 8, wherein
the CDC further comprises a further scaling block for providing further downscaled voltages of the first and second reference voltages at fifth and sixth reference terminals depending on a further scaling factor;
each of the one or more reference charge stores of the reference block has a first end coupled to the input of the comparator and a second end connected to either the fifth or the sixth reference terminal depending on a control signal provided by the SAR logic.

11. The CDC according to claim 8, wherein each of the one or more reference charge stores of the reference block has a predefined scaling with respect to a reference capacitance value and wherein the output value depends on a ratio between the reference capacitance value and the capacitance value of the sensor element scaled with the scaling factor.

12. The CDC according to claim 1, wherein the scaling factor is set according to at least one of the following:
by programming via a programming interface;
by a calibration procedure taking into account an actual value of a capacitive sensor element connected to the first and second measurement terminals;
by a fixed setting.

13. The CDC according to claim 1, wherein the scaling block comprises a digital-to-analog converter for providing the downscaled voltages at the third and fourth reference terminals depending on the scaling factor.

14. An integrated sensor interface comprising a CDC according to claim 1.

15. A sensor device comprising a CDC according to claim 1 and the capacitive sensor element that is configured for measuring a physical or chemical quantity such as pressure, proximity, humidity, gas concentration, acceleration, tilt, angle.

16. The sensor device according to claim 15, further comprising a radio frequency identification, RFID, circuit for transmission of data associated with the capacitive sensor element, the RFID circuit contributing to the power supply of the sensor device.

\* \* \* \* \*